United States Patent
Cho et al.

(10) Patent No.: US 9,578,749 B2
(45) Date of Patent: Feb. 21, 2017

(54) ELEMENT EMBEDDED PRINTED CIRCUIT BOARD AND METHOD OF MANUFACTURING THE SAME

(71) Applicant: Samsung Electro-Mechanics Co., Ltd., Suwon-si (KR)

(72) Inventors: Jung-Hyun Cho, Busan (KR); Yong-Ho Baek, Seoul (KR); Young-Gwan Ko, Seoul (KR); Jae-Hoon Choi, Yongin-si (KR); Jung-Hyun Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/943,866

(22) Filed: Nov. 17, 2015

(65) Prior Publication Data
US 2016/0143142 A1    May 19, 2016

(30) Foreign Application Priority Data

Nov. 18, 2014  (KR) .................. 10-2014-0160570

(51) Int. Cl.
| | | |
|---|---|---|
| *H05K 1/16* | (2006.01) |
| *H05K 1/11* | (2006.01) |
| *H05K 7/00* | (2006.01) |
| *H05K 1/18* | (2006.01) |
| *H05K 3/30* | (2006.01) |
| *H05K 3/00* | (2006.01) |
| *H05K 3/42* | (2006.01) |

(52) U.S. Cl.
CPC ............. *H05K 3/007* (2013.01); *H05K 1/187* (2013.01); *H05K 3/42* (2013.01); *H05K 2201/10015* (2013.01)

(58) Field of Classification Search
CPC .......... H05K 3/007; H05K 3/42; H05K 1/187; H05K 2201/10015
USPC ............ 174/260, 262; 361/760, 761; 29/832
See application file for complete search history.

(56) References Cited

U.S. PATENT DOCUMENTS

| | | | | |
|---|---|---|---|---|
| 8,076,586 B2* | 12/2011 | Tuominen | ........... | H01L 23/5389 174/252 |
| 2006/0291173 A1* | 12/2006 | Cho | ........ | H01L 24/97 361/760 |
| 2011/0180312 A1* | 7/2011 | Kim | ..... | H05K 1/0231 174/260 |
| 2011/0290546 A1* | 12/2011 | Lee | ....... | H01L 21/568 174/260 |

* cited by examiner

*Primary Examiner* — Sherman Ng
(74) *Attorney, Agent, or Firm* — NSIP Law

(57) ABSTRACT

An element embedded printed circuit board includes: a substrate including an insulation layer, a first circuit layer formed on a first surface of the insulation layer, and a second circuit layer formed on a second surface of the insulation layer; and an element including an electrode part and embedded in the insulation layer, wherein the electrode part is in contact with the first circuit layer.

14 Claims, 22 Drawing Sheets

ELEMENT EMBEDDED PRINTED CIRCUIT BOARD AND METHOD OF MANUFACTURING THE SAME

CROSS-REFERENCE TO RELATED APPLICATION(S)

This application claims the benefit of Korean Patent Application No. 10-2014-0160570 filed in the Korean Intellectual Property Office on Nov. 18, 2014, the entire disclosure of which is incorporated herein by reference for all purposes.

BACKGROUND

1. Technical Field

The following description relates to an element embedded printed circuit board and a method of manufacturing the same.

2. Description of Related Art

As electronic products such as mobile communication devices in the IT industry become increasingly smaller, there have been increased demands that circuit boards embedded in these electronic products become more integrated and thinner with multifunctionality. Accordingly, the application of printed circuit boards having electronic components embedded therein have been emerged to cope with the trends toward electronic products with higher electrical performance.

Although there is a manufacturing technology that has been developed to solve current problems through the application of electronic component embedded printed circuit boards, in which an electronic component such as an IC, a semiconductor chip, an active component or a passive component is embedded therein, there may still be difficulty in implementing finer circuit patterns in the electronic component embedded printed circuit boards by the conventional methods such as Semi Addictive Process (SAP).

In the conventional method, a copper clad laminate (CCL) is used for a core substrate, and then an electronic component may be embedded in a cavity after the cavity is formed in the core substrate. However, since there is a difference in thickness between the cavity formed in the core substrate and the electronic component being embedded therein, an additional layer may be required to electrically connect the electronic component to the outside.

In a conventional electronic component embedded printed circuit board, a cavity is formed generally in an insulation layer of the printed circuit board, and then an electronic component such as an IC or a semiconductor chip is inserted in the cavity. Then, adhesive resin such as prepreg is coated on the insulation layer having the electronic component embedded therein and the inside of the cavity. As such, the electronic component may be fixed to the cavity by use of the adhesive resin while the adhesive resin forms the insulation layer.

An electronic component embedded printed circuit board is disclosed in U.S. Pat. No. 7,886,433.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, an element embedded printed circuit board includes: a substrate including an insulation layer, a first circuit layer formed on a first surface of the insulation layer, and a second circuit layer formed on a second surface of the insulation layer; and an element having an electrode part and embedded in the insulation layer, wherein the electrode part is in contact with the first circuit layer.

The first circuit layer may include an embedded pattern formed inside the insulation layer and a protruding pattern formed outside the insulation layer.

The element embedded printed circuit board may further include a conductive adhesive layer disposed between the electrode part and the protruding pattern.

The element embedded printed circuit board may further include a non-conductive adhesive layer formed on an outside surface of the element, wherein the first circuit layer is formed on the outside surface of the element.

The embedded pattern may include a circuit pattern formed on an outside surface of the element.

The element embedded printed circuit board may further include a micro via providing electrical connection between the electrode part and the second circuit layer.

The element embedded printed circuit board may further include a penetration via providing electrical connection between the first circuit layer and the second circuit layer.

The element may be a passive element.

According to another general aspect, a method of manufacturing an element embedded printed circuit board includes: preparing a carrier member including an element mounting portion and a circuit portion formed on at least one of a first surface thereof or a second surface thereof; forming a first circuit pattern on the circuit portion; mounting an element on the element mounting portion, the element including an electrode part; forming a laminated body by laminating an insulation layer on the carrier member; separating the laminated body from at least a portion of the carrier member; and forming a first circuit layer on a first surface of the laminated body and forming a second circuit layer on a second surface of the laminated body, the first circuit layer including a second circuit pattern in contact with the electrode part.

The mounting of the element may include, before the element is mounted, forming a conductive adhesive layer on the carrier member at areas where the electrode part is to be in contact with the carrier member.

The mounting of the element may include, before the element is mounted, forming a non-conductive adhesive layer on the carrier member at areas where the element is to be mounted in contact with the carrier member.

A cavity for accommodating the element may be formed in the insulation layer.

The first circuit pattern may include a circuit pattern formed on an outside surface of the element.

The method may further include: forming micro vias providing electrical connection between the electrode part and the second circuit layer; and forming penetration vias providing electrical connection between the first circuit layer and the second circuit layer.

The element may be a passive element.

The method may further include forming a solder resist layer on the first surface of the laminated body and the second surface of the laminated body.

The method may further include: coating a metal material on an outside surface of the electrode part before the element is mounted; and melting the metal material, after the element is mounted, to couple the electrode part to the first circuit layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, an element embedded printed circuit board and a method of manufacturing the same in accordance with certain embodiments will be described in detail with reference to the accompanying drawings.

Element Embedded Printed Circuit Board

Figure 1:
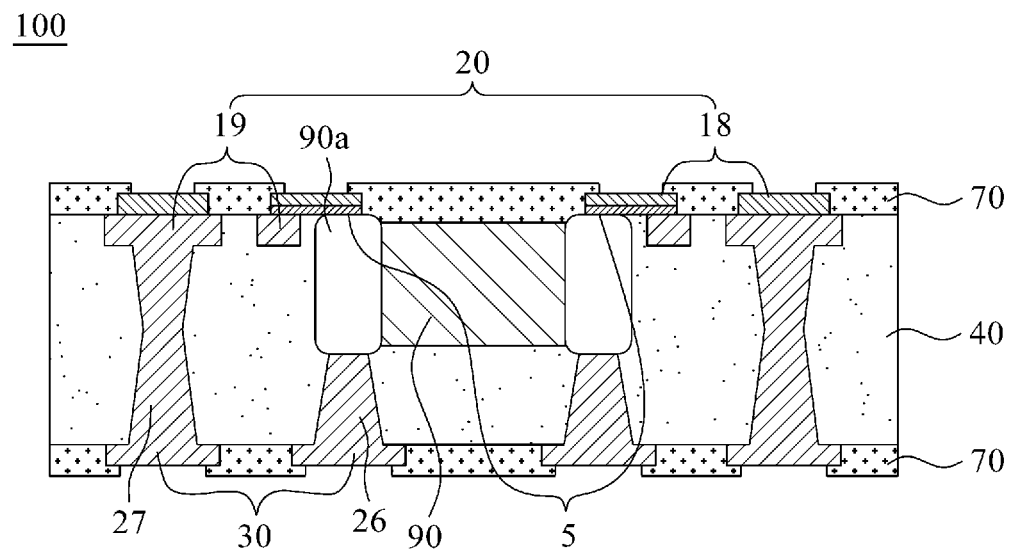
FIG. 1 is a cross-sectional view showing an element embedded printed circuit board according to an example.
Figure 2:
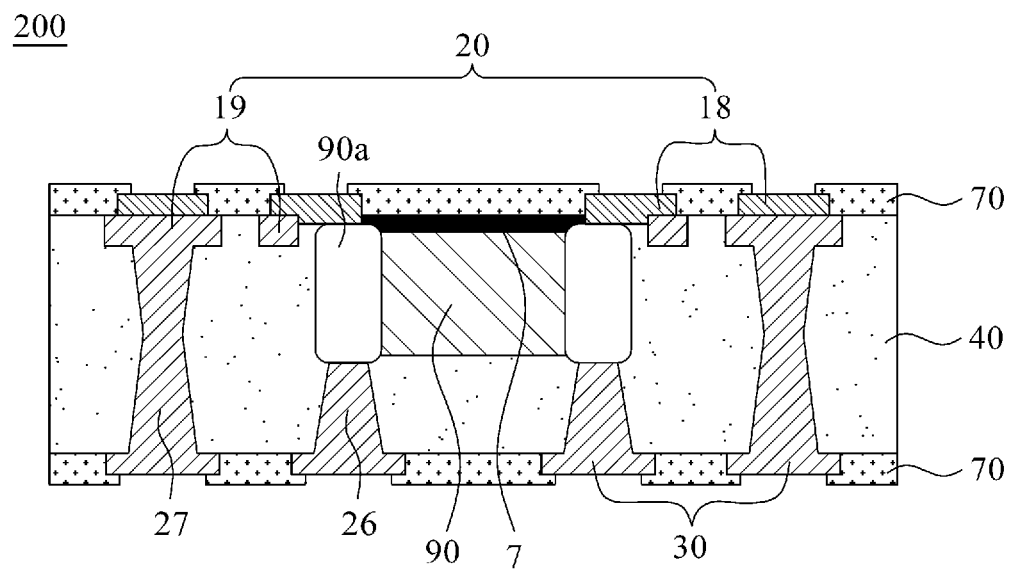
FIG. 2 is a cross-sectional view showing an element embedded printed circuit board according to another example.
Figure 3A:
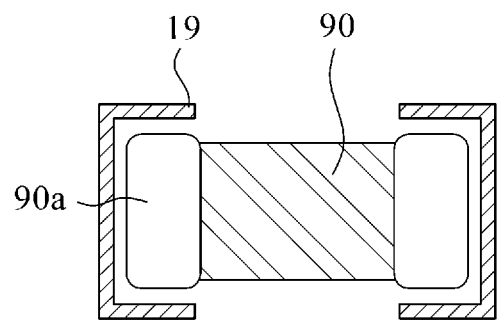
FIGS. 3A-3L are plan views showing various examples of an embedded pattern that is formed on an outer circumferential surface of an element embedded printed circuit board, according to an example.
Figure 3B:
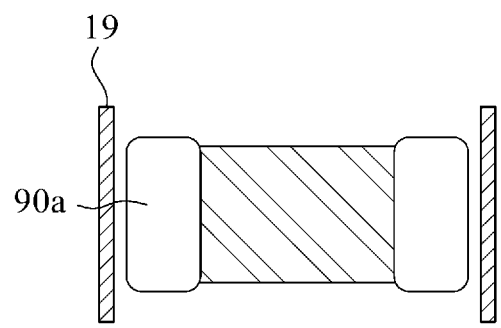
Figure 3C:
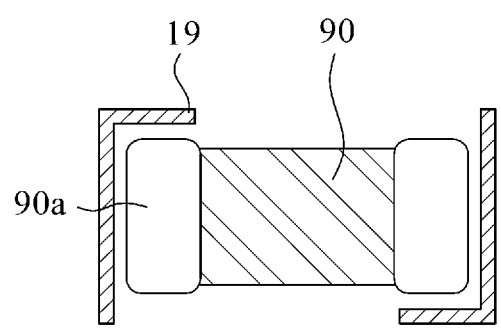
Figure 3D:
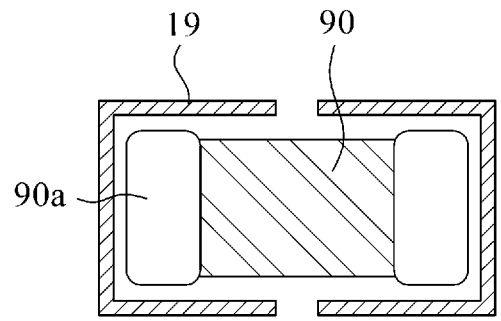
Figure 3E:
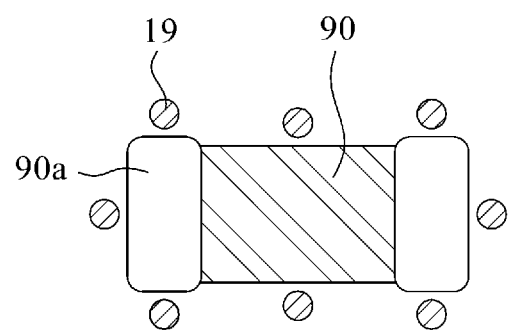
Figure 3F:
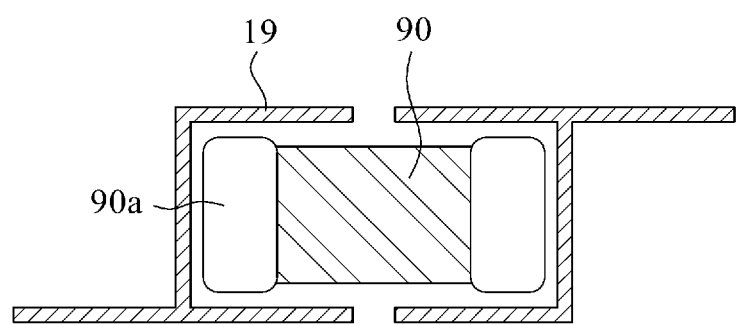
Figure 3G:
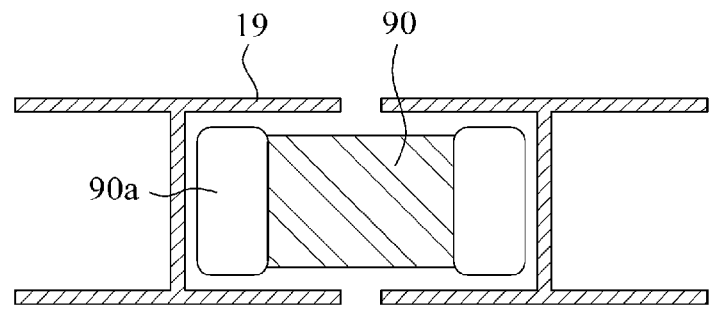
Figure 3H:
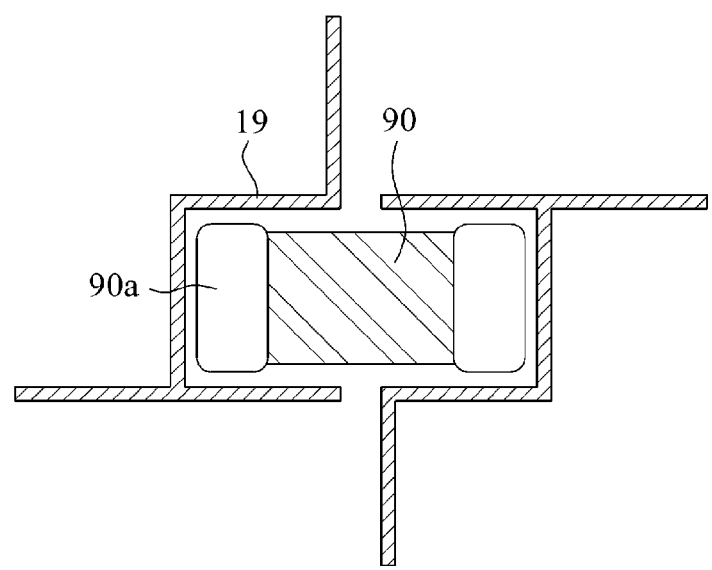
Figure 3I:
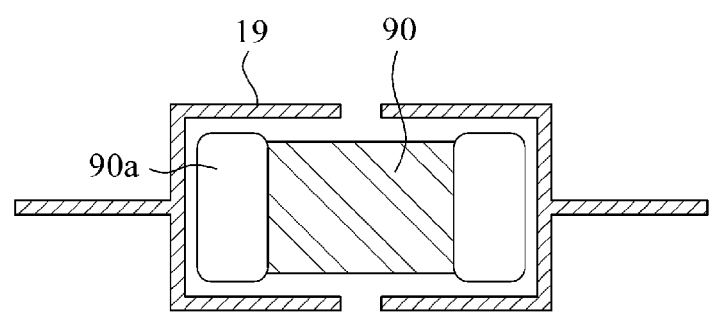
Figure 3J:
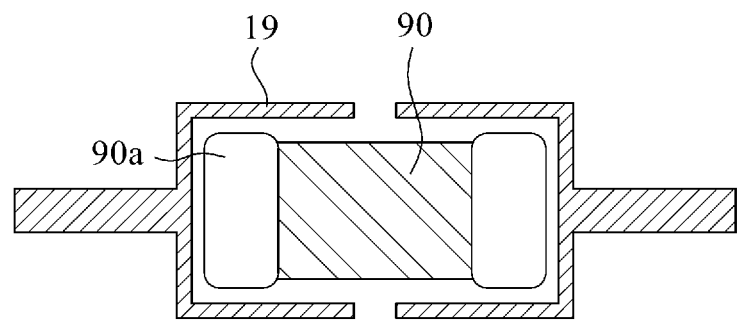
Figure 3K:
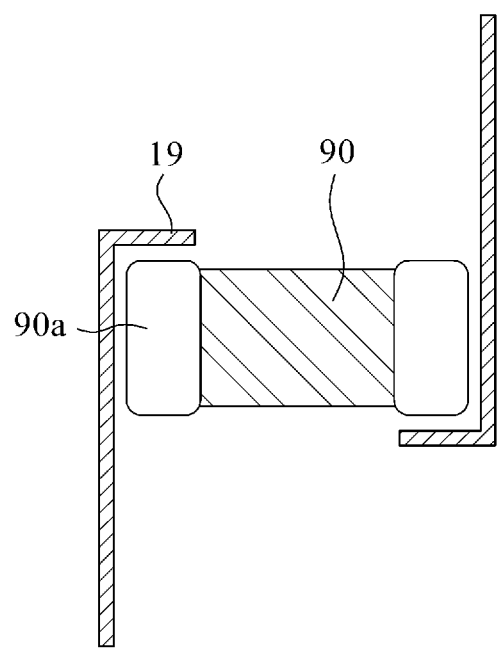
Figure 3L:
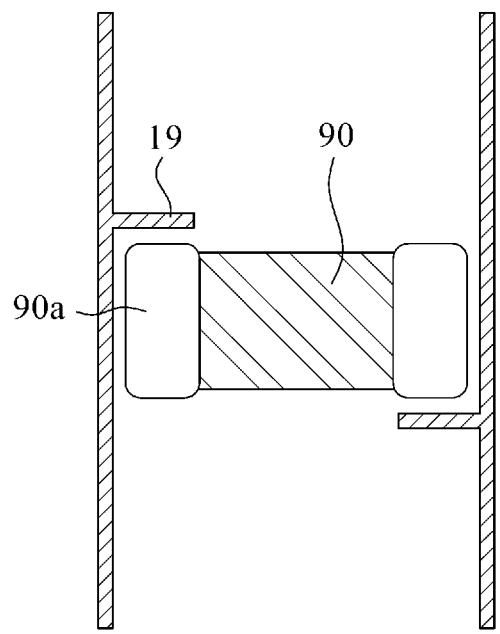

FIG. 1 is a cross-sectional view showing an element embedded printed circuit board 100 according to an example, and FIG. 2 is a cross-sectional view showing an element embedded printed circuit board 200 according to another example.

Referring to FIG. 1, the printed circuit board 100 includes a substrate and an element 90. The substrate includes a first circuit layer 20 formed on one surface of an insulation layer 40 and a second circuit layer 30 formed on another, opposite surface of the insulation layer 40, and the element 90 includes an electrode part 90a and is embedded in the insulation layer 40 of the substrate.

Here, the electrode part 90a of the element 90 is in contact with the first circuit layer 20. In this configuration of the printed circuit board 100, since no additional circuit layer is required for connecting the element 90 with the first circuit layer 20, the element 90 is in direct contact with the first circuit layer 20 and thus the printed circuit board 100 is thinner than it would be if an additional circuit layer were included for connecting the element 90 with the first circuit layer 20. The terms "direct contact" in this case mean that interposing structural elements, other than an attachment material such as adhesive, are not included between the element 90 and the first circuit layer 20. Moreover, since the electrode part 90a of the element 90 is in direct contact with the first circuit layer 20, contact areas between the electrode part 90a of the element 90 and the first circuit layer 20 may be wider, compared to a case in which the electrode part of the element 90 is connected to the first circuit layer 20 by an additional circuit layer or the like, for example, a circuit layer similar to a via 27, thereby making the quality of contact more reliable.

The insulation layer 40 may be any type of material as long as the insulation layer 40 is made of insulation resin, which is commonly used as an insulation material for making a printed circuit board. Accordingly, various types of materials such as epoxy resin, thermosetting resin, thermo-softening resin similar to polyimide, plate-shaped prepreg in which resin is impregnated in a material constructed with a woven type of glass cloth or fabric cloth, or photo curing resin, which is cured by use of light, may be used as the insulation layer 40. For instance, the insulation layer 40 may be made of resin such as Ajinomoto Build-up Film, FR-4, BT (Bismaleimide Triazine) or the like.

Although the element 90 is not specifically restricted herein, the element 90 may be a passive element 90. More specifically, a Multi-Layer Ceramic Capacitor (MLCC) may be employed as the element 90.

The first circuit layer 20 includes an embedded pattern 19 which is formed on an inside of the insulation layer 40, and a protruding pattern 18 which is formed on an outside of the insulation layer 40. Moreover, the protruding pattern 18 may be in direct contact with the electrode part of the element 90 and may electrically connect the embedded pattern 19 with the element 90.

The element 90 may be embedded in the printed circuit board 100 by use of a conventional adhesive material. The adhesive material may be made of conductive resin or non-conductive resin. For example, a conductive adhesive layer 5 that includes conductive resin is interposed between the electrode part 90a of the element 90 and the protruding pattern 18.

Referring to FIG. 2, in a printed circuit board 200 according to another example, a non-conductive adhesive layer 7 that includes non-conductive resin may be formed on an outside surface, which is a part where the first circuit layer 20 is formed in a horizontal direction, of the element 90. The adhesive layer 7 may be arranged so as not to entirely cover the electrode part 90a, thereby enabling the electrode part 90a to make direct contact with the first circuit layer 20.

Although it is not illustrated in the accompanying drawings, according to yet another example, the element 90 may be embedded in the printed circuit board 100 without having the aforementioned adhesive material. A metal material that has a low melting point may be coated on an outside surface of the electrode part of the element 90. Accordingly, after the element 90 is embedded in the printed circuit board 100, the low melting point metal material coated on the outside surface of the electrode part 90a of the element 90 may be melted through a heat process, and thus may function to couple the electrode part 90a to the protruding part 18 formed on the electrode part 90a, thereby increasing the adhesion between the protruding part 18 and the electrode part 90a. As a result, the element 90 may be embedded in the printed circuit board 100 without having the aforementioned adhesive material.

FIGS. 3A-3L are plan views showing various example types of the embedded pattern 19 that is formed on an outer circumferential surface, which is a part where an element 90 is embedded, of the printed circuit boards 100 and 200. FIG. 4 is a plan view showing various example patterns of the conductive adhesive layer 5 that is coated on the electrode part 90a of the element 90 in the printed circuit board 100.

Referring to FIGS. 3A-3L, the embedded pattern 19 is formed on an outside surface of the element 90. As illustrated in FIGS. 3A-3L, the embedded pattern 90 may be formed in various patterns. However, this disclosure is not limited to what is illustrated in FIGS. 3A-3L. Furthermore, FIGS. 3F-3L show examples in which the embedded pattern 19 is extended and may be connected to the element 90 while being connected to another circuit portion.

Figure 4A:
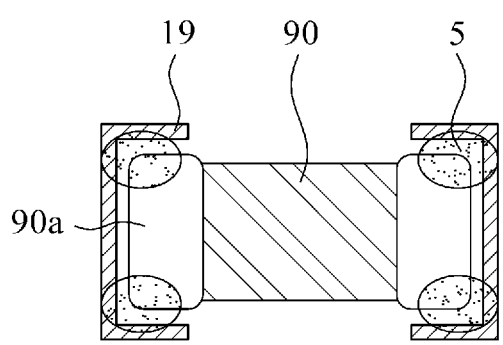
FIGS. 4A-4C are plan views showing various example patterns of a conductive adhesive material that is coated on an electrode part of an element of an element embedded printed circuit board.
Figure 4B:
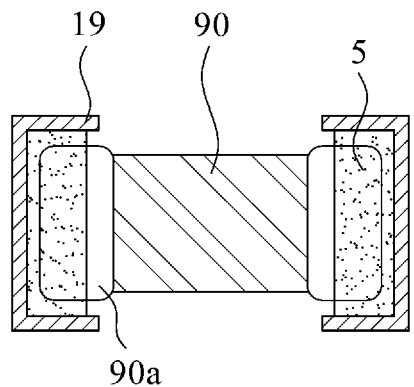
Figure 4C:
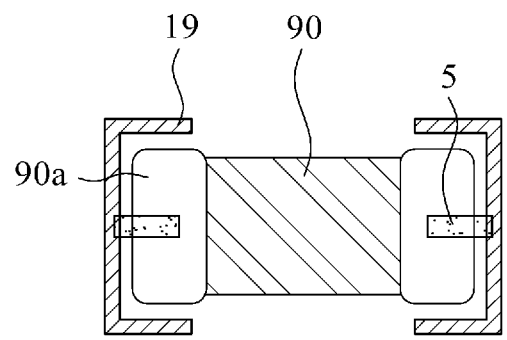

Accordingly, as illustrated in FIGS. 4A-4C, when a conductive adhesive is coated on the electrode part of the element 90 to form the conductive adhesive layer 5, the conductive adhesive becomes more like a liquid through a heating process, and in such case the embedded pattern 19 formed on an outside surface of the electrode part 90a of the element 90 functions as a dam preventing the conductive adhesive from being spread.

As shown in FIGS. 1 and 2, in the printed circuit boards 100 and 200, a micro via 26 for electrical connection is formed between the electrode part 90a of the element 90 and the second circuit layer 30, and a penetration via 27 is formed between the first circuit layer 20 and the second circuit layer 30.

A circuit layer including the vias 26 and 27 may be made of copper (Cu) as long as the circuit layer is made of a conductive material which is commonly used as a conductive material for a circuit layer in the field of printed circuit boards. Accordingly, this disclosure is not limited to what is described herein, and thus various types of conductive materials can be employed for the circuit layer.

A conventional solder resist layer 70, which is a protection layer to expose a connection pad and is commonly formed in a liquid state or a film shape, can be formed on the surfaces of the substrate including the first circuit layer 20 and the second circuit layer 30. Moreover, a surface treatment layer can be selectively formed on the connection pad, which is exposed through an opening of the solder resist layer 70.

The surface treatment layer may be formed using various known methods, for example, an electro gold plating method, an immersion gold plating method, an organic solderability preservative method, an immersion tin plating method, an immersion silver plating method, a direct immersion gold plating (DIG) method, a hot air solder levelling (HASL) method and the like. However, this disclosure is not limited to the methods described herein, and other various known methods of forming surface treatment layers may be used. A connection pad that is formed through the aforementioned processes can be used as a wire bonding pad or a bump pad according to the intended purposes of the printed circuit board 200, or can be used as a solder-balling pad for mounting an outside connection terminal such as a solder ball.

Accordingly, the printed circuit boards 100 and 200 allow a direct connection between the element 90 and the first circuit layer 20, and thus does not require an additional circuit layer for electrical connection between the element 90 and the first circuit layer 20, thereby making the printed circuit board 100 and 200 thinner. Moreover, since the electrode part 90a of the element 90 and the first circuit layer 20 are directly connected to each other, contact areas between them become wider, improving electrical reliability.

Method of Manufacturing Element Embedded Printed Circuit Board

FIGS. 5 to 21 show the process flow of an example method of manufacturing the element embedded printed circuit board 100.

Figure 5:
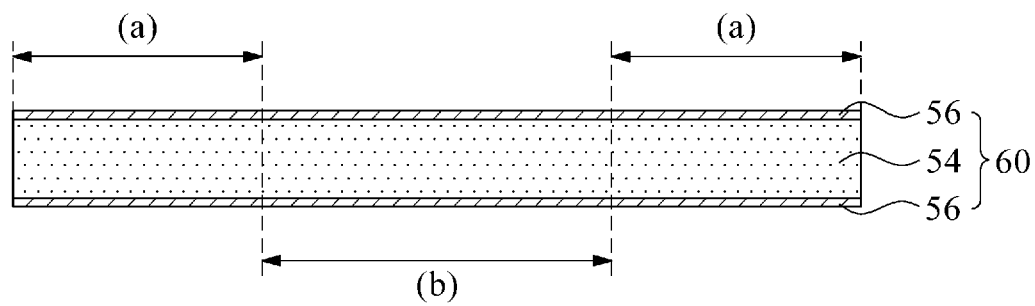
FIGS. 5 to 21 show the process flow of a method of manufacturing an element embedded printed circuit board according to an example.

Referring to FIG. 5, a carrier member 60 having a circuit portion (a) and an element mounting portion (b) formed on one surface (e.g., a top surface) thereof or both surfaces (e.g., a top surface and a bottom surface) thereof is prepared.

The carrier member 60 includes a pair of metal layers 56 and a core layer 54, which is formed between the pair of metal layers 56. The metal layers 56 may be made of copper, but the disclosure is not limited to what is described herein. The core layer 54 is for supporting an insulation layer, a circuit layer and the like, and may be made of an insulation material or a metal material. A copper-clad laminate, for example, may be used for the carrier member 60.

Moreover, the carrier member 60 may have only one core layer 54, or may have the metal layer 56 formed on only one surface thereof. The carrier member 60 may be used as a support substrate in the field of printed circuit boards, and the carrier 60 could be used in various ways without any further limitations if the carrier 60 could be detached or removed.

Figure 6:
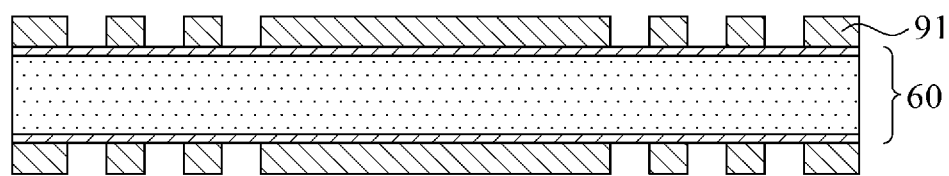
Figure 7:
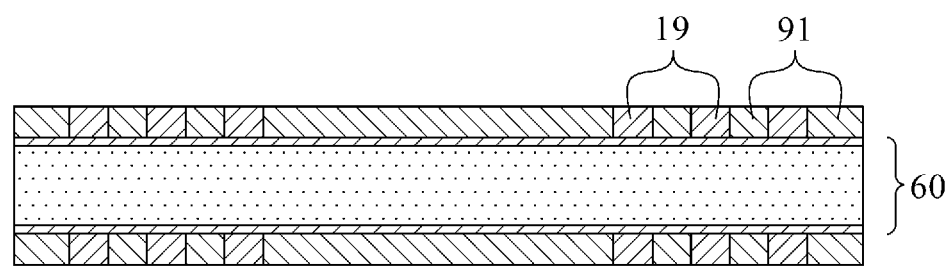
Figure 8:
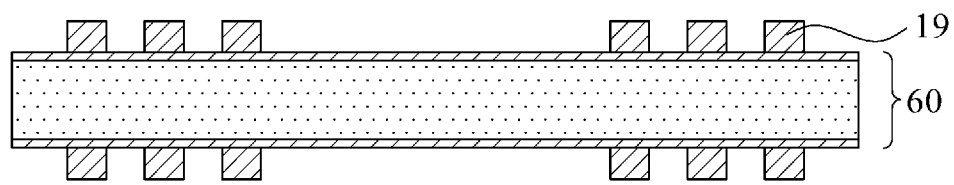

Referring to FIGS. 6-8, a plating resist layer 91, which has an opening formed on the circuit portion (a) of the carrier member 60 only, is formed on both surfaces of the carrier member 60. After a metal material is filled in the opening, the plating resist layer 91 is removed, and then a first circuit pattern 19 is formed on the circuit portion (a) of the carrier member 60.

It shall be apparent that the method is not limited to this embodiment, and the first circuit pattern 19 can be formed by well-known manufacturing processes in the field of printed circuit boards. Moreover, the process of forming the first circuit pattern 19 may be omitted according to the final structure to be formed.

Moreover, the first circuit pattern 19 may be formed on only one surface of the carrier member 60, and may function as an embedded pattern, which is formed inside the insulation layer 40 in its final structure. However, the disclosure is not limited to this embodiment.

Figure 9:
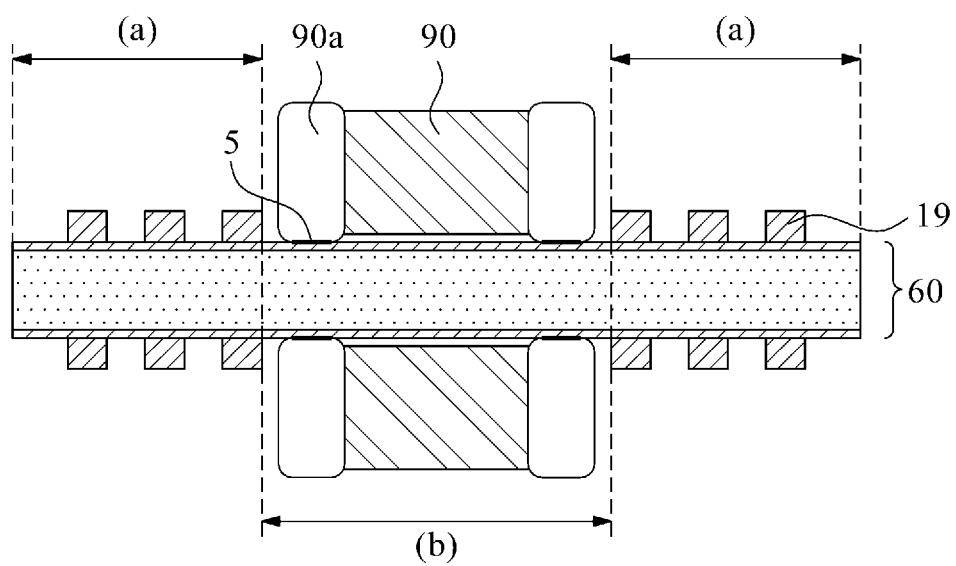

Referring to FIG. 9, the element 90 having the electrode part 90a formed therein is mounted on the element mounting portion (b) of the carrier member 60. The element 90 is coupled to the carrier member 60 using an adhesive material.

Here, before the element 90 is mounted on the carrier member 60, the conductive adhesive layer 5 is formed at areas where the electrode part 90a of the element 90 is to be in contact with the carrier member 60, such that the element 90 is fixed to the carrier member 60 through the conductive adhesive layer 5.

The element 90 may be a passive element. However, the disclosure is not restricted to what is illustrated herein, and an electronic component, for example, a Multi-Layer Ceramic Capacitor (MLCC), may be used for the element 90.

Figure 10:
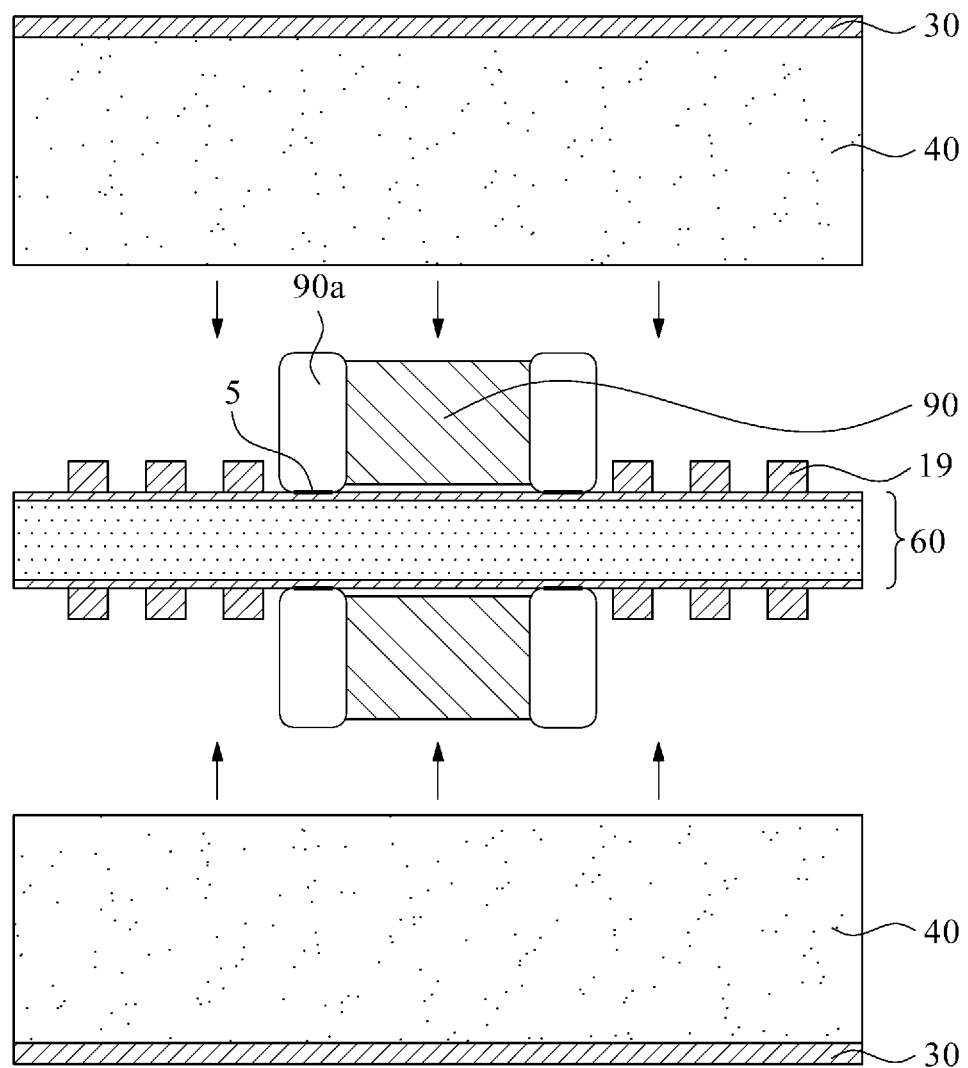
Figure 11:
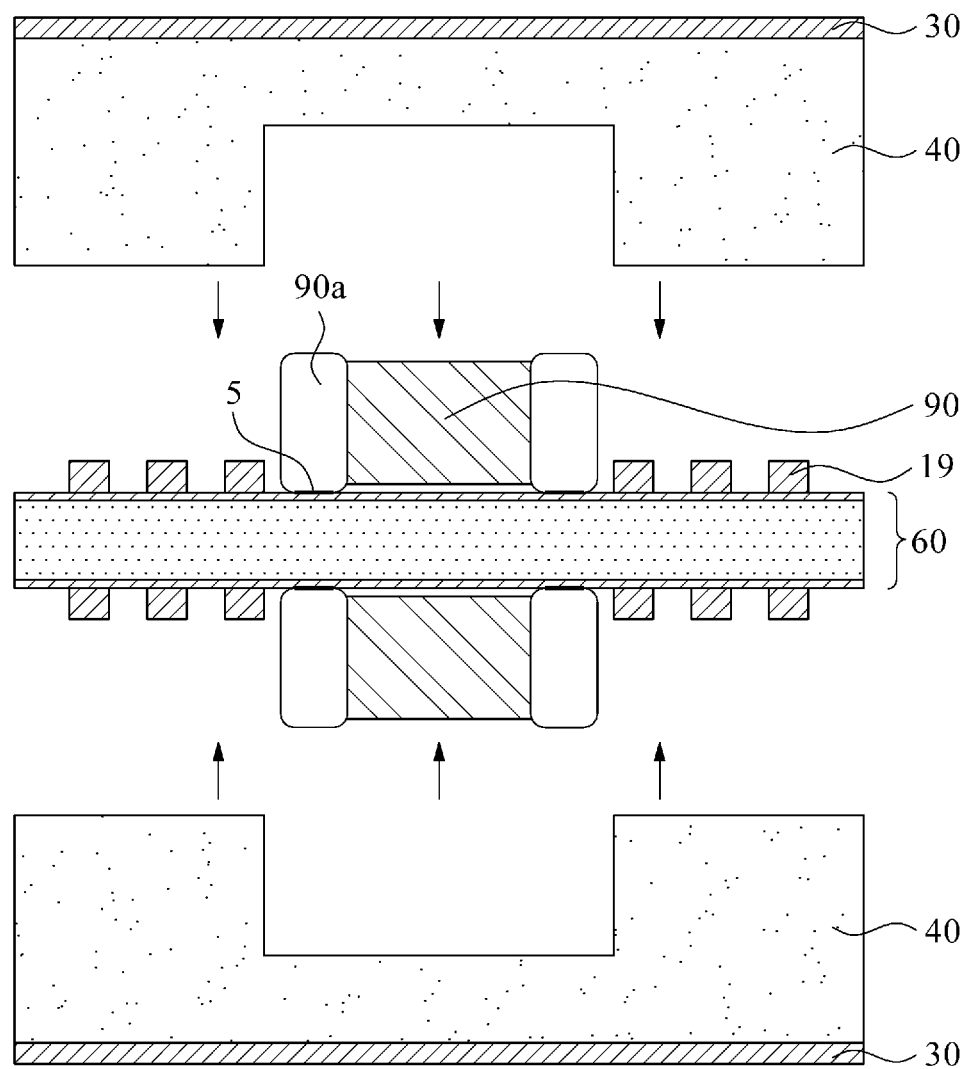
Figure 12:
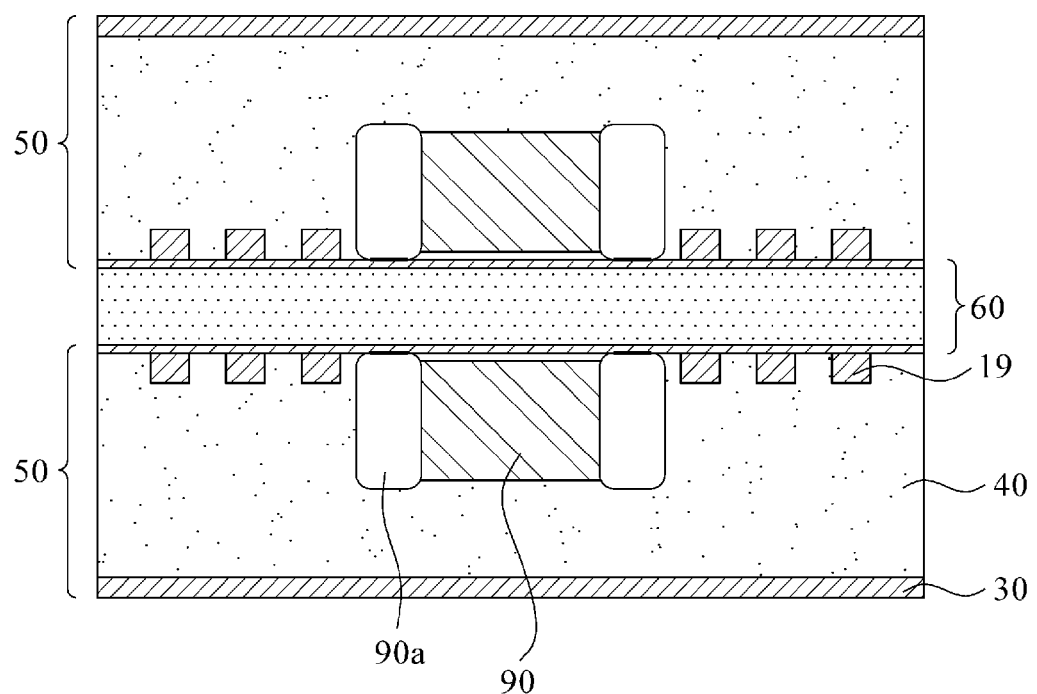

Referring to FIGS. 10-12, the insulation layer 40 is laminated on the carrier member 60 having the element 90 mounted thereon to form a laminated body 50.

Although the insulation layer 40 shown in FIG. 10 has a film-shaped structure that is a semisolid and the insulation layer 40 shown in FIG. 11 has a structure in which a cavity is formed to accommodate the element 90, the disclosure is not restricted to what is illustrated herein.

Figure 13:
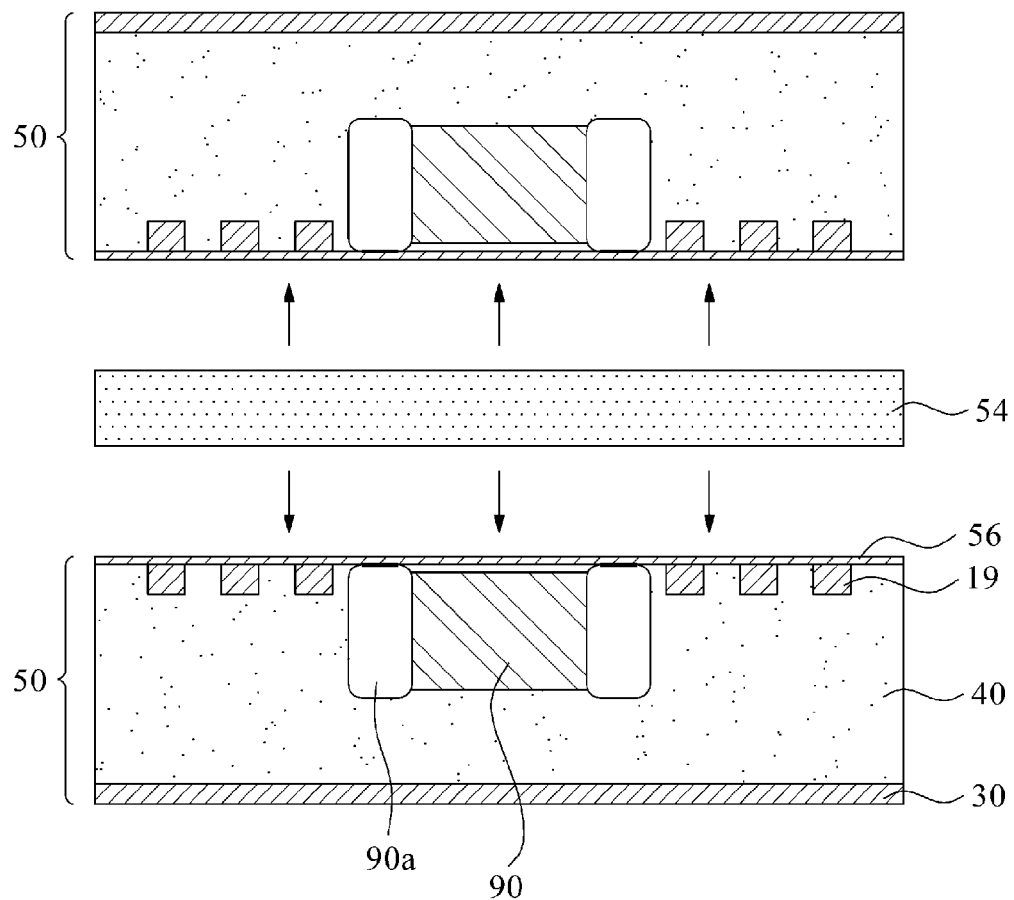

Referring to FIG. 13, the laminated body 50 is separated from the core layer 54. By removing the core layer 54, the laminated body 50 formed on both surfaces of the carrier member 60 is separated, and thus a pair of laminated bodies 50 can be obtained. Although it is not illustrated in the drawings, it is also possible that only one laminated body 50 is formed on one surface of the carrier member 60 and then separated to obtain only the one laminated body 50.

Figure 14:
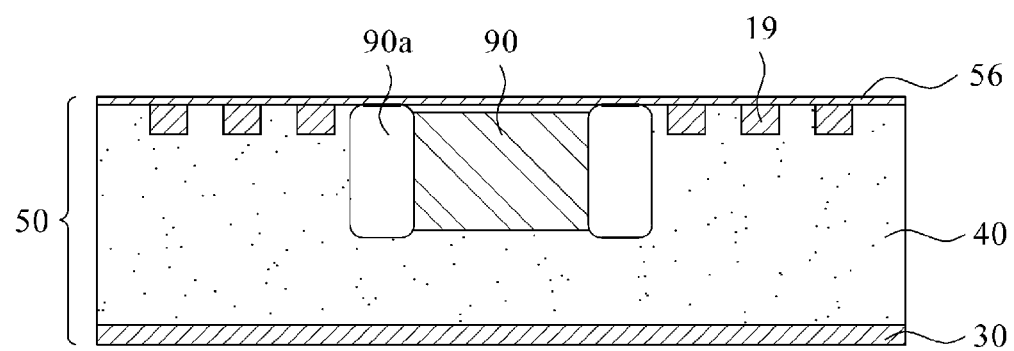

Although the laminated body 50 shown in FIG. 14 is obtained by removing the core layer 54 of the carrier member 60 only, it is also possible that the entire carrier member 60 including the core layer 54 and the metal layers 56 formed on either surface of the core layer 54 may be removed in some cases to obtain the laminated body 50.

Although a method to remove the core layer 54/carrier member 60 may be changed according to the structure and material of the carrier member 60, the disclosure is not restricted to what is described herein.

Figure 15:
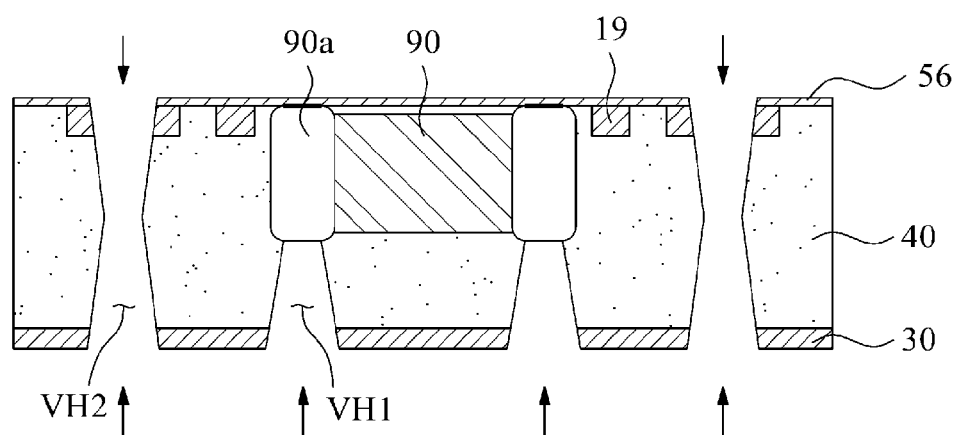

Referring to FIG. 15, via holes VH1 and VH2 are formed for electrical interlayer connection in the separated laminated body 50. Although the forming of the via holes VH1 and VH2 may be performed through a conventional razor process, the disclosure is not restricted to a razor process.

Figure 16:
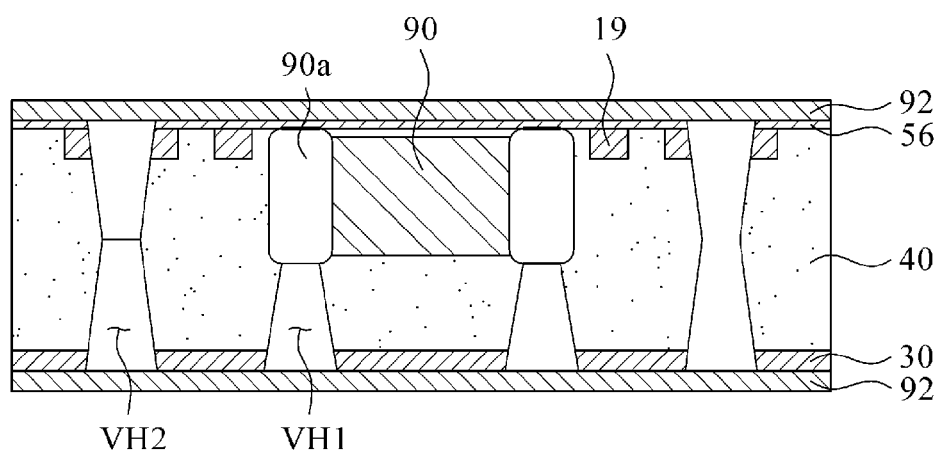
Figure 17:
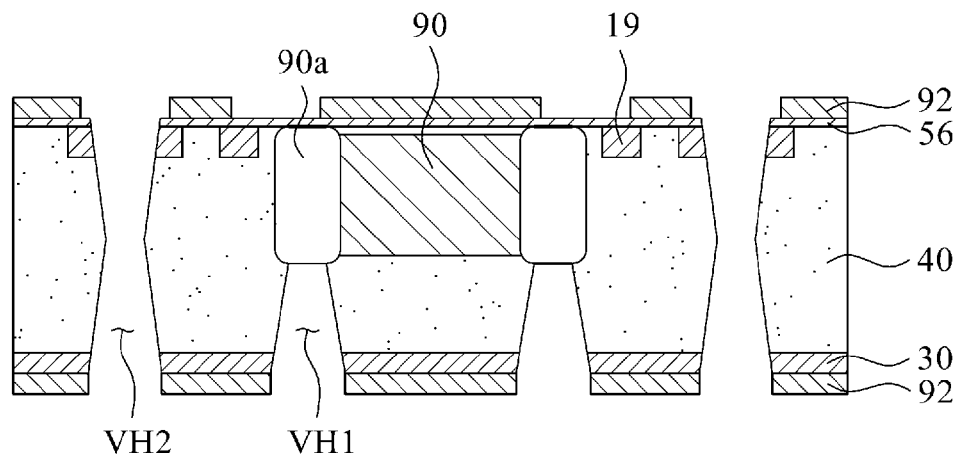

Referring to FIGS. 16 and 17, a plating resist layer 92 is formed on the laminated body 50 having the via holes VH1 and VH2 formed therein, and then exposing and developing processes are performed on the plating resist layer 92 so that a patterned metal plating layer that is patterned on both surfaces of the laminated body 50 including an inside of the via holes VH1 and VH2 may be formed.

Figure 18:
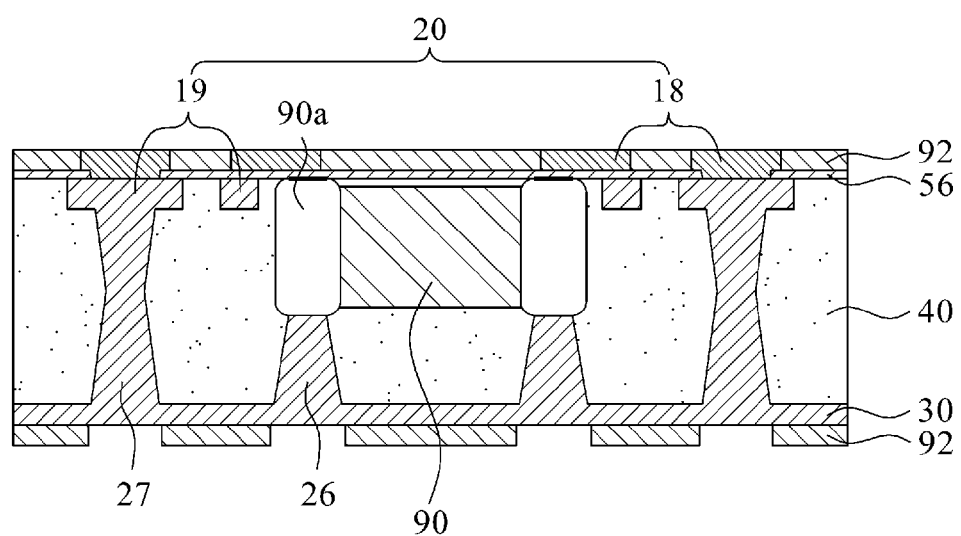

Referring to FIG. 18, the patterned metal plating layer that is patterned on both surfaces of the laminated body 50 including the inside of the via holes VH1 and VH2 is formed. That is, the first circuit layer 20 including the second circuit pattern 18 in contact with the electrode part 90a of the element 90 is formed on one surface of the laminated body 50, and the second circuit layer 30 is formed on the other surface of the laminated body 50.

The first circuit layer 20 includes the embedded pattern 19 that is formed inside the insulation layer 40 and the protruding pattern 18 that is formed outside the insulation layer 40. The embedded pattern 19 includes a circuit pattern that is formed on an outside surface of the element 90.

When a conductive adhesive is coated on the electrode part of the element 90 to form the adhesive layer 5, the conductive adhesive becomes more like a liquid through a heating process, and in this case the embedded pattern 19 formed on an outside surface of the electrode part of the element 90 functions as a dam preventing the conductive adhesive from being spread.

Figure 19:
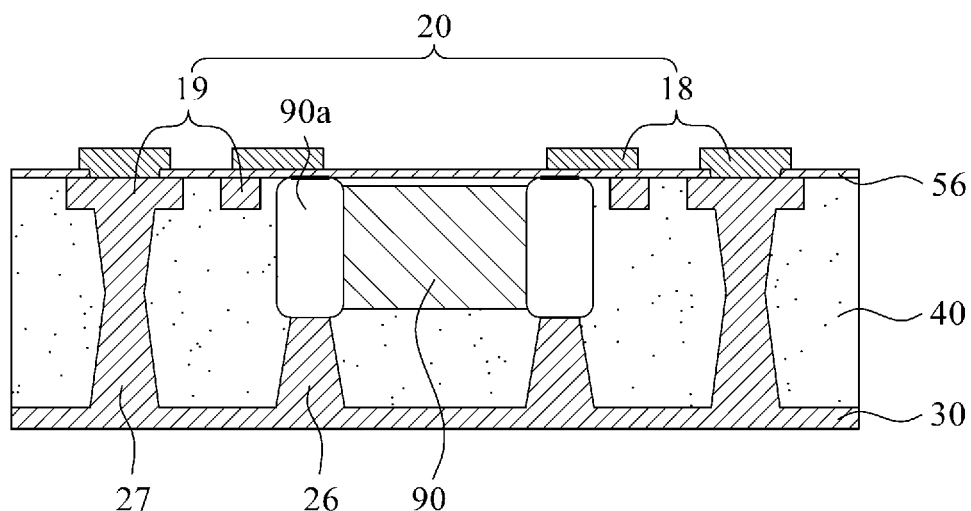
Figure 20:
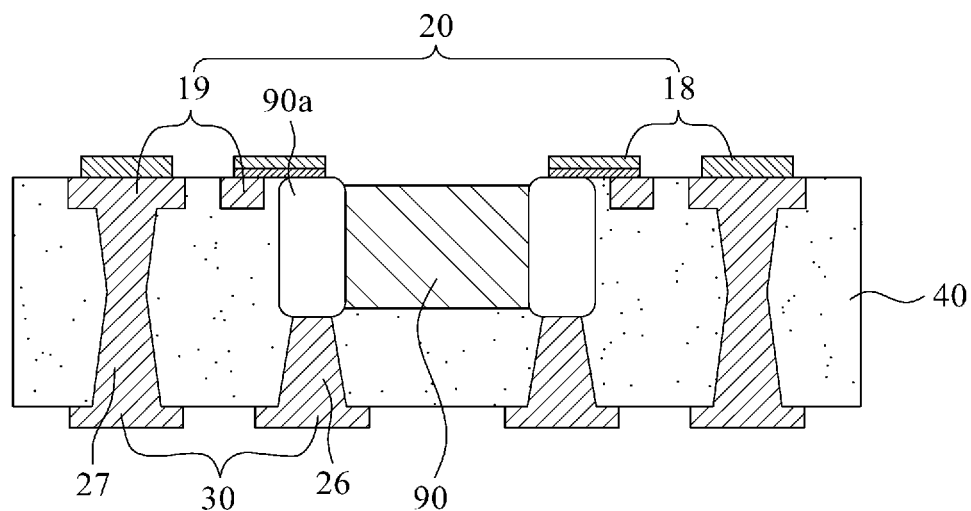

Likewise, referring to FIGS. 19 and 20, the plating resist layer 92 that is patterned through the exposing and developing processes is peeled, and unnecessary portions of the second circuit layer 30 and the metal layer 56 of the carrier member 60 are removed through a conventional process such as flash etching.

Through the processes described above, the forming of the first circuit layer 20 and the second circuit layer 30 includes forming a plurality of micro vias 26 for electric connection between the electrode part 90a of the element 90 and the second circuit layer 30 and forming a plurality of penetration vias 27 for electrical interlayer connection between the first circuit layer 20 and the second circuit layer 30.

As described above, the method of manufacturing an element embedded printed circuit board 100, according to an example, allows a direct connection between the element 90 and the first circuit layer 20, and thus does not require an additional circuit layer for electrical connection between the element 90 and the first circuit layer 20, thereby making the printed circuit board 100 thinner. Moreover, since the electrode part 90a of the element 90 and the first circuit layer 20 are directly connected to each other, contact areas between the electrode part 90a of the element 90 and the first circuit layer 20 become wider, possibly improving electrical reliability. Furthermore, since the embedded pattern of the first circuit layer 20 is formed on an outside surface of the element 90, the embedded pattern functions as a dam to prevent a conductive adhesive from being spread.

Figure 21:
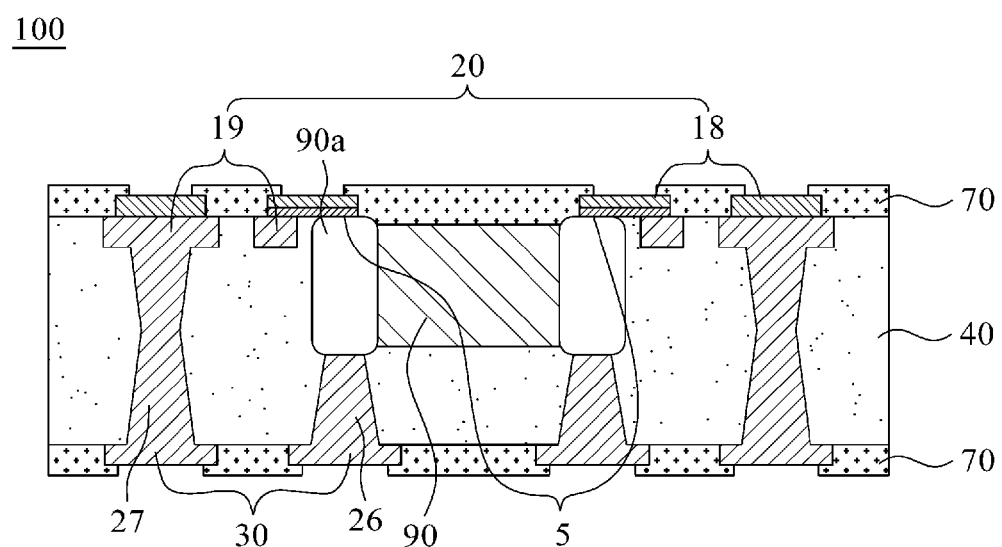

Referring to FIG. 21, in the printed circuit board 100 including the first circuit layer 20 formed on one surface of the insulation layer 40 and the second circuit layer 30 formed on the other surface, the solder resist layer 70, which is a protection layer to expose a connection pad and commonly formed in a liquid state or a film shape, is formed. Moreover, a surface treatment layer may be selectively formed on the connection pad exposed through an opening of the solder resist layer 70. A description of the connection pad and the surface treatment layer, which has already been provided, will not be repeated hereinafter.

FIGS. 22 to 32 show the process flow of a method of manufacturing the element embedded printed circuit board 200 according to an example.

Figure 22:
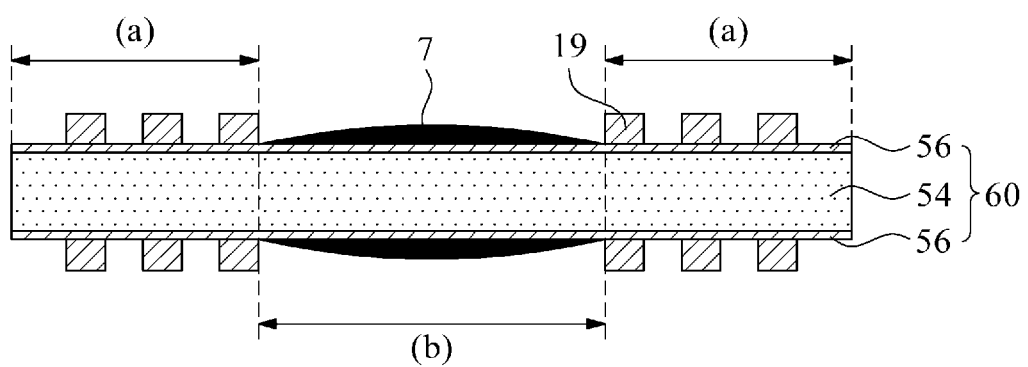
FIGS. 22 to 32 show the process flow of a method of manufacturing an element embedded printed circuit board according to another example.

Referring to FIG. 22, the carrier member 60 having the circuit portion (a) and the element mounting portion (b) formed on one surface thereof or both surfaces thereof is provided. The circuit portion (a) has a first circuit pattern 19 formed thereon, and the element mounting portion (b) has a non-conductive adhesive layer 7 formed thereon, at areas with which the element 90 mounted on the carrier member 60 is to be in contact, before the element 90 is mounted on the element mounting portion (b).

It shall be apparent that the disclosure is not limited to this embodiment, and the first circuit pattern 19 can be formed by well-known manufacturing processes in the field of printed circuit boards. Moreover, the process of forming the first circuit pattern 19 may be omitted according to the final structure to be formed.

Moreover, it is possible to form the first circuit pattern 19 on only one surface of the carrier member 60, and the first circuit pattern 19 may function as an embedded pattern 19, which is formed inside the insulation layer 40 in its final structure. However, it shall be apparent the disclosure is not limited to this embodiment.

Figure 23:
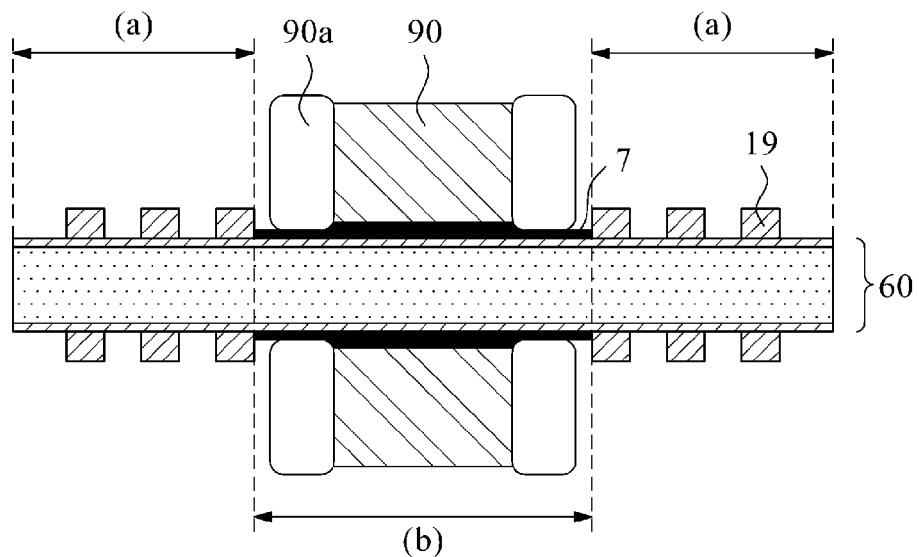

Referring to FIG. 23, the element 90 having the electrode part 90a formed therein is mounted on the element mounting portion (b) of the carrier member 60 including the non-conductive adhesive layer 7. The element 90 is fixed to the carrier member 60 by using the non-conductive adhesive layer 7.

The element 90 may be a passive element. However, the disclosure is not restricted to what is illustrated herein, and an electronic component, for example, a Multi-Layer Ceramic Capacitor (MLCC), may be used for the element 90.

Figure 24:
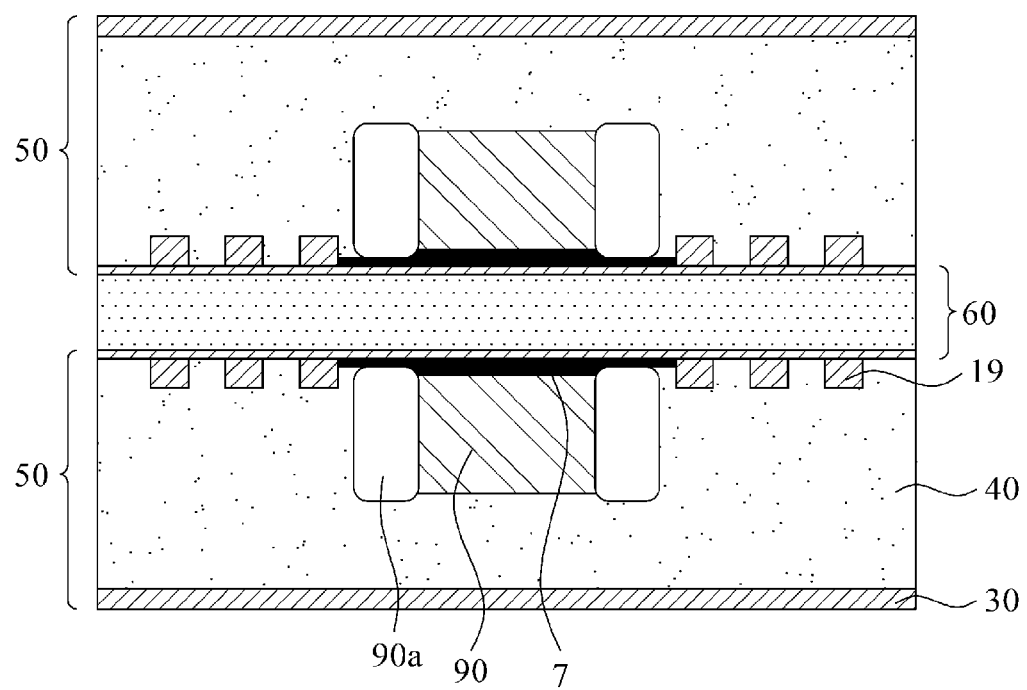

Referring to FIG. 24, the insulation layer 40 is laminated on the carrier member 60, on which the element 90 is mounted, to form a laminated body 50. For example, the insulation layer 40 may have a film-shaped structure that is a semisolid, and can have a structure in which a cavity is formed to accommodate the element 90. However, the disclosure is not restricted to what is described herein.

Figure 25:
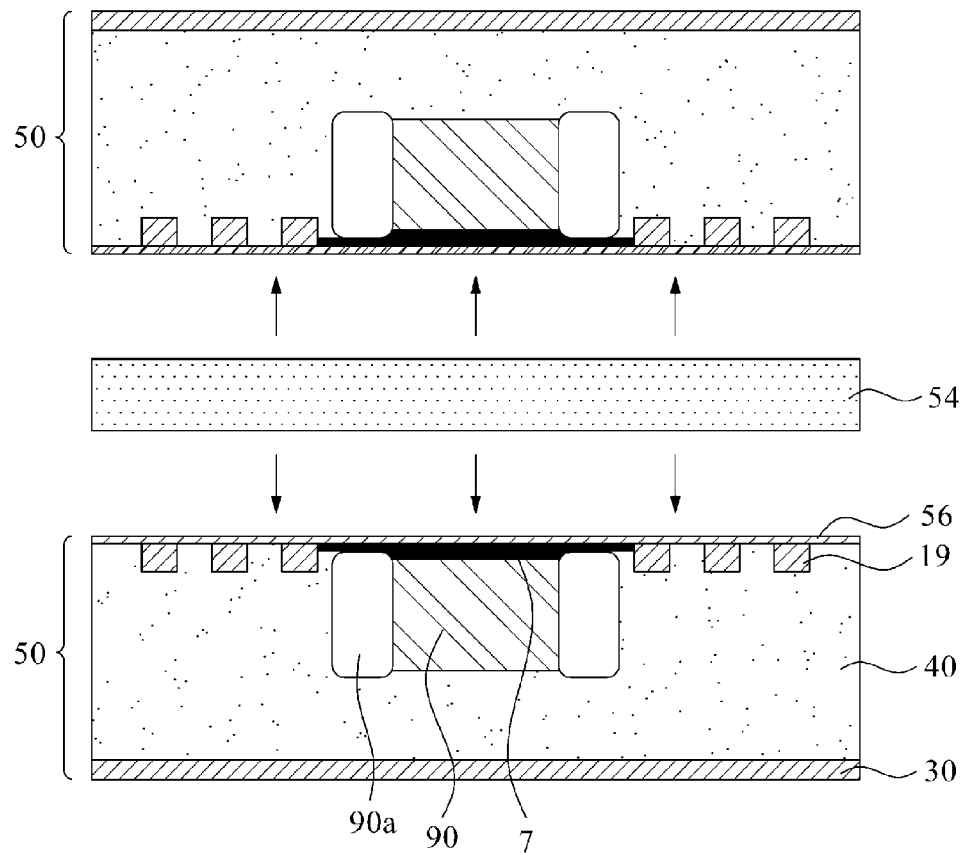

Referring to FIG. 25, the laminated body 50 is separated from the core layer 56 of the carrier member 60. By removing the core layer 54, the laminated body 50 formed on both surfaces of the carrier member 60 is separated, and thus a pair of laminated bodies 50 may be obtained. Moreover, it is possible that only one laminated body 50 is formed on one surface of the carrier member 60 and then separated to obtain only the one laminated body 50.

Figure 26:
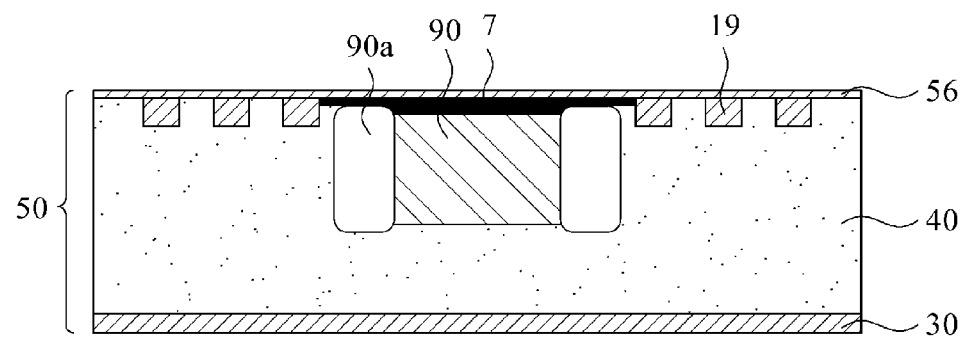

Although the laminated body 50 shown in FIG. 26 is obtained by removing the core layer 54 of the carrier member 60 only, it is also possible that the entire carrier member 60 including the core layer 54 and the metal layers 56 formed on either surface of the core layer 54 may be removed in some cases to obtain the laminated body 50.

Although a method to remove the core layer 54/carrier member 60 may be changed according to the structure and material of the carrier member 60, the disclosure is not restricted to what is described herein.

Figure 27:
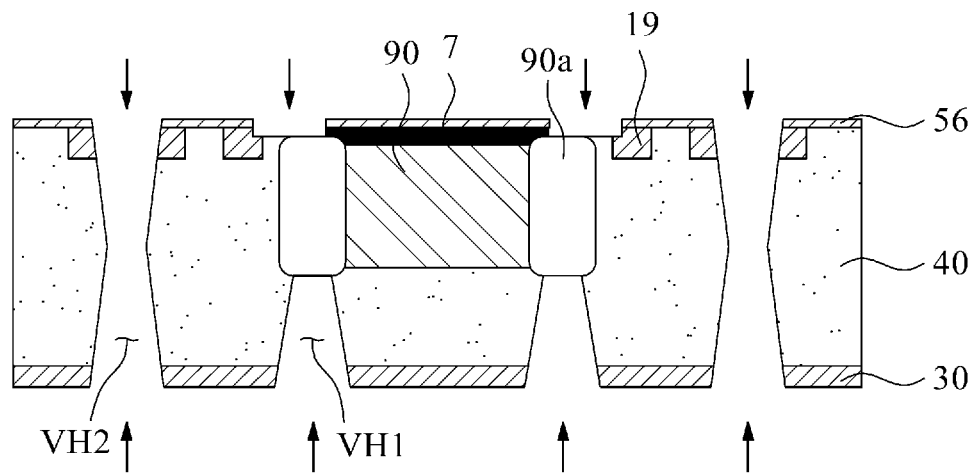

Referring to FIG. 27, via holes VH1 and VH2 are formed for electrical interlayer connection in the separated laminated body 50. Although the forming of the via holes VH1 and VH2 may be performed through a conventional razor process, the disclosure is not restricted to what is described herein. Moreover, as illustrated in FIG. 27, at least a portion of the non-conductive adhesive layer 7 that is formed on the electrode part 90a of the element 90 is removed from the laminated body 50 by further performing a razor process. This is done for the purpose of removing an insulation material in order to electrically connect a circuit to the electrode part 90a of the element 90.

Figure 28:
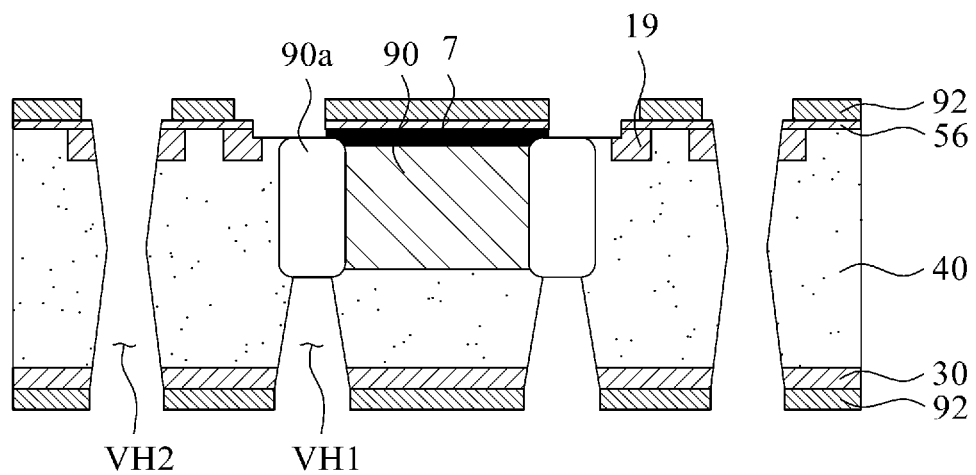

Referring to FIG. 28, exposing and developing processes are performed on the plating resist layer 92 in order to form a metal plating layer that is patterned on the laminated body 50 having the via holes VH1 and VH2 formed therein.

Figure 29:
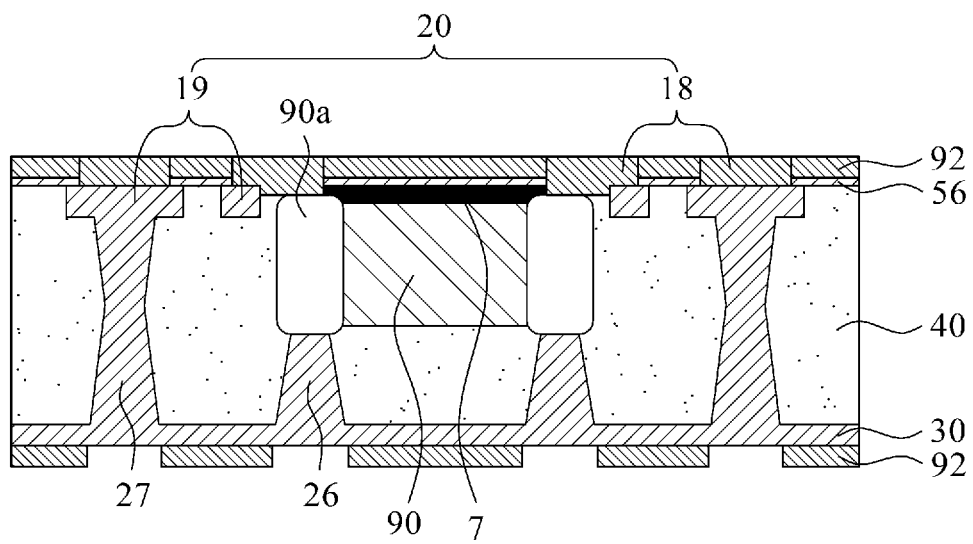

Referring to FIG. 29, the metal plating layer that is patterned on both surfaces of the laminated body 50 including the inside of the via holes VH1 and VH2 is formed. That is, the first circuit layer 20, which includes the second circuit pattern 18 in contact with the electrode part 90a of the element 90, is formed on one surface of the laminated body 50, and the second circuit layer 30 is formed on the other surface of the laminated body 50.

The first circuit layer 20 includes the embedded pattern 19 that is formed inside the insulation layer 40 and the protruding pattern 18 that is formed outside the insulation layer 40. The embedded pattern 19 includes a circuit pattern that is formed on an outside surface of the element 90.

Figure 30:
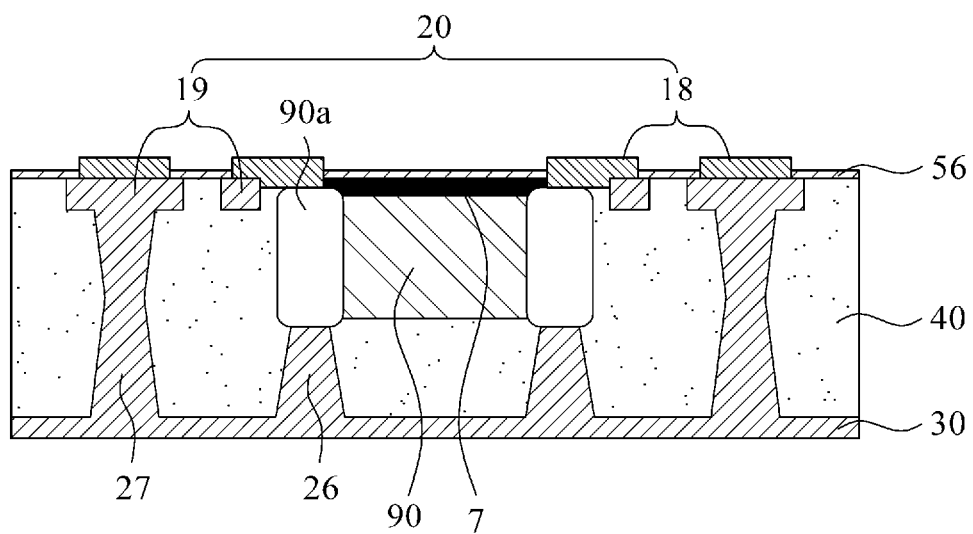
Figure 31:
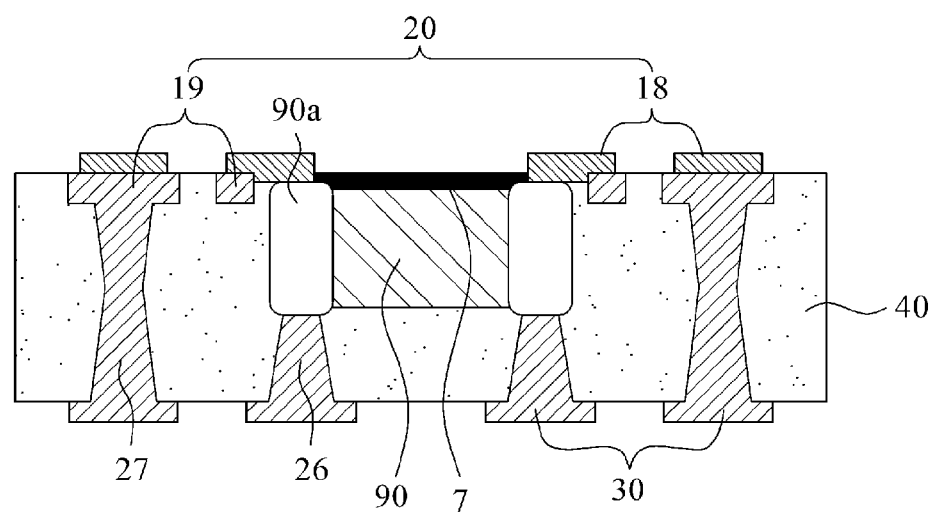

Likewise, referring to FIGS. 30 and 31, the plating resist layer 92 that is patterned through the exposing and developing processes is peeled, and unnecessary portions of the second circuit layer 30 and the metal layer 56 of the carrier member 60 are removed through a conventional process such as flash etching.

Through the processes described above, forming the first circuit layer 20 and the second circuit layer 30 includes forming a plurality of micro vias 26 for electric connection between the electrode part of the element 90 and the second circuit layer 30 and forming a plurality of penetration vias 27 for electrical interlayer connection between the first circuit layer 20 and the second circuit layer 30.

Figure 32:
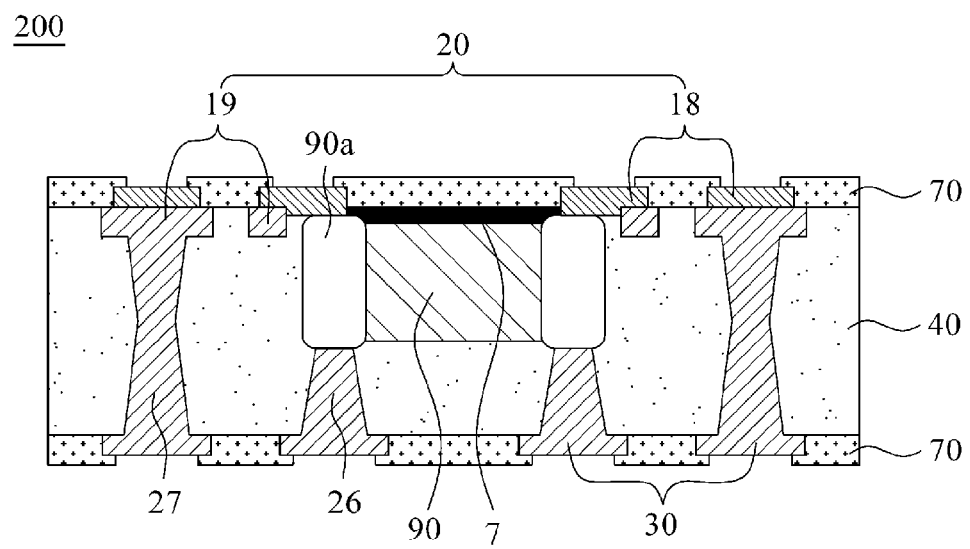

Referring to FIG. 32, in the printed circuit board 200 including the first circuit layer 20 formed on one surface of the insulation layer 40 and the second circuit layer 30 formed on the other surface thereof, the solder resist layer 70 is formed. Moreover, a surface treatment layer may be selectively formed on the connection pad, which is exposed through an opening of the solder resist layer 70. A description of the connection pad and the surface treatment layer, which has already been provided, will not be repeated hereinafter.

As described above, the method of manufacturing the element embedded printed circuit board 200 is different from the previously described embodiment in that the adhesive layer 7 is made of a non-conductive material, rather than the conductive material of the adhesive layer 5. Also, the method of manufacturing the element embedded printed circuit board 200 allows a direct connection between the element 90 and the first circuit layer 20, and thus does not require an additional circuit layer for electrical connection between the element 90 and the first circuit layer 20, making the printed circuit board thinner. Moreover, since the electrode part 90a of the element and the first circuit layer 20 are directly connected to each other, contact areas between them become wider, thereby improving electrical reliability.

Although not shown in the accompanying drawings, in a method of manufacturing a printed circuit board according to yet another example, the printed circuit board may be manufactured without having to use an additional adhesive to fix the element to the printed circuit board. For example, a metal material that has a low melting point may be coated on an outside surface of the electrode part 90a of the element 90. Accordingly, after the element 90 is embedded in the printed circuit board, the low melting point metal material coated on the outside surface of the electrode part 90a of the element 90 may be melted through a heat process, and thus may function to fix the electrode part 90a to the protruding part 18 formed on the electrode part 90a, thereby increasing the adhesion between the protruding part 18 and the electrode part 90a. As a result, the element 90 may be embedded in the printed circuit board without having a conventional adhesive material. Therefore, the manufacturing process becomes simpler because it does not require the conventional adhesive forming process, and thus the manufacturing cost and time may be saved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An element embedded printed circuit board comprising: a substrate comprising an insulation layer, a first circuit layer formed on a first surface of the insulation layer, and comprising an embedded pattern formed inside the insulation layer and a protruding pattern formed outside the insulation layer, and a second circuit layer formed on a second surface of the insulation layer; an element embedded in the insulation layer and comprising an electrode part in contact with the first circuit layer; and a conductive adhesive layer disposed between the electrode part and the protruding pattern.

2. The element embedded printed circuit board of claim 1, further comprising a non-conductive adhesive layer formed on an outside surface of the element, wherein the first circuit layer is formed on the outside surface of the element.

3. The element embedded printed circuit board of claim 1, wherein the embedded circuit pattern comprises a circuit pattern formed on an outside of the element.

4. The element embedded printed circuit board of claim 1, further comprising a micro via providing electrical connection between the electrode part and the second circuit layer.

5. The element embedded printed circuit board of claim 1, further comprising a penetration via providing electrical connection between the first circuit layer and the second circuit layer.

6. The element embedded printed circuit board of claim 1, wherein the element is a passive element.

7. A method of manufacturing an element embedded printed circuit board, comprising: preparing a carrier member comprising an element mounting portion and a circuit portion formed on at least one of a first surface thereof or a second surface thereof; forming a first circuit pattern on the circuit portion; mounting an element on the element mounting portion, the element comprising an electrode part; forming a laminated body by laminating an insulation layer on the carrier member; separating the laminated body from at least a portion of the carrier member; and forming a first circuit layer on a first surface of the laminated body and forming a second circuit layer on a second surface of the laminated body, the first circuit layer comprising a second circuit pattern in contact with the electrode part, wherein the first circuit pattern comprises an embedded pattern formed inside the insulation layer, the second circuit pattern comprises a protruding pattern formed outside the insulation layer, wherein the mounting of the element comprises, before the element is mounted, forming a conductive adhesive layer on the carrier member at areas where the electrode part is to be in contact with the carrier member, and wherein the conductive adhesive layer is disposed between the electrode part and the protruding pattern after the separation of the laminated body from at least a portion of the carrier member.

8. The method of claim 7, wherein the mounting of the element comprises, before the element is mounted, forming a non-conductive adhesive layer on the carrier member at areas where the element is to be mounted in contact with the carrier member.

9. The method of claim 7, wherein a cavity for accommodating the element is formed in the insulation layer.

10. The method of claim 7, wherein the first circuit pattern comprises a circuit pattern formed on an outside surface of the element.

11. The method of claim 7, further comprising: forming micro vias providing electrical connection between the electrode part and the second circuit layer; and forming penetration vias providing electrical connection between the first circuit layer and the second circuit layer.

12. The method of claim 7, wherein the element is a passive element.

13. The method of claim 7, further comprising forming a solder resist layer on the first surface of the laminated body and the second surface of the laminated body.

14. The method of claim 7, further comprising: coating a metal material on an outside surface of the electrode part before the element is mounted; and melting the metal material, after the element is mounted, to couple the electrode part to the first circuit layer.

* * * * *